(12) United States Patent
Brask et al.

(10) Patent No.: US 7,157,378 B2
(45) Date of Patent: Jan. 2, 2007

(54) METHOD FOR MAKING A SEMICONDUCTOR DEVICE HAVING A HIGH-K GATE DIELECTRIC LAYER AND A METAL GATE ELECTRODE

(75) Inventors: Justin K. Brask, Portland, OR (US); Chris E. Barns, Portland, OR (US); Mark L. Doczy, Beaverton, OR (US); Uday Shah, Portland, OR (US); Jack Kavalieros, Portland, OR (US); Matthew V. Metz, Hillsboro, OR (US); Suman Datta, Beaverton, OR (US); Anne E. Miller, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/885,958

(22) Filed: Jul. 6, 2004

(65) Prior Publication Data

US 2006/0008968 A1    Jan. 12, 2006

(51) Int. Cl.
*H01L 21/302* (2006.01)

(52) U.S. Cl. .............. 438/704; 257/E21.444; 257/E21.453; 257/E21.624; 257/E21.625; 257/E21.638; 257/E21.639; 257/E21.655; 438/183; 438/216; 438/287; 438/591; 438/654; 438/656; 438/FOR. 193

(58) Field of Classification Search ........... 438/183, 438/216, 287, 591, 653, 654, 656, 722, 626, 438/627, 628, 240, 244, 254, 387, 397, 704, 438/FOR. 193; 257/E21.444, E21.453, E21.624, 257/E21.625, E21.638, E21.639, E21.655

See application file for complete search history.

(56) References Cited

U.S. PATENT DOCUMENTS

| 6,060,376 | A | 5/2000 | Gabriel et al. |
| 6,063,698 | A | 5/2000 | Tseng et al. ............... 438/585 |
| 6,140,688 | A | 10/2000 | Gardner et al. |
| 6,184,072 | B1 | 2/2001 | Kaushik et al. ............ 438/197 |
| 6,218,302 | B1 * | 4/2001 | Braeckelmann et al. .... 438/687 |
| 6,255,698 | B1 | 7/2001 | Gardner et al. ............ 257/369 |
| 6,329,232 | B1 | 12/2001 | Yang et al. |

(Continued)

FOREIGN PATENT DOCUMENTS

EP    0 899 784 AZ    3/1999

(Continued)

OTHER PUBLICATIONS

"Electron Work Function of the Elements", CRC Handbook of Chemistry and Physics, Internet Version 2005, David R. Lide, ed., <http://www.hbcpnetbase.com>, CRC Press, Boca Raton, Fl, 2005.*

(Continued)

*Primary Examiner*—George R. Fourson
*Assistant Examiner*—Julio J. Maldonado
(74) *Attorney, Agent, or Firm*—Rahul D. Engineer

(57) ABSTRACT

A method for making a semiconductor device is described. That method comprises forming a dielectric layer on a substrate, forming a trench within the dielectric layer, and forming a high-k gate dielectric layer within the trench. After forming a first metal layer on the high-k gate dielectric layer, a second metal layer is formed on the first metal layer. At least part of the second metal layer is removed from above the dielectric layer using a polishing step, and additional material is removed from above the dielectric layer using an etch step.

20 Claims, 4 Drawing Sheets

U.S. PATENT DOCUMENTS

| | | | |
|---|---|---|---|
| 6,365,450 B1 | 4/2002 | Kim | 438/216 |
| 6,368,923 B1 | 4/2002 | Huang | |
| 6,376,888 B1 * | 4/2002 | Tsunashima et al. | 257/407 |
| 6,410,376 B1 | 6/2002 | Ng et al. | 438/199 |
| 6,420,279 B1 | 7/2002 | Ono et al. | 438/785 |
| 6,465,290 B1 | 10/2002 | Suguro et al. | |
| 6,475,874 B1 | 11/2002 | Xiang et al. | 438/396 |
| 6,514,828 B1 | 2/2003 | Ahn et al. | 438/240 |
| 6,544,906 B1 | 4/2003 | Rotondaro et al. | 438/785 |
| 6,586,288 B1 | 7/2003 | Kim et al. | 438/183 |
| 6,617,209 B1 | 9/2003 | Chau et al. | 438/240 |
| 6,617,210 B1 | 9/2003 | Chau et al. | 438/240 |
| 6,620,713 B1 | 9/2003 | Arghavani et al. | 438/585 |
| 6,630,741 B1 * | 10/2003 | Lopatin et al. | 257/762 |
| 6,642,131 B1 | 11/2003 | Harada | 438/591 |
| 6,667,246 B1 | 12/2003 | Mitsuhashi et al. | 438/756 |
| 6,689,675 B1 | 2/2004 | Parker et al. | 438/585 |
| 6,696,327 B1 | 2/2004 | Brask et al. | 438/197 |
| 6,696,345 B1 | 2/2004 | Chau et al. | 438/387 |
| 2001/0027005 A1 * | 10/2001 | Moriwaki et al. | 438/592 |
| 2002/0058374 A1 | 5/2002 | Kim et al. | 438/228 |
| 2002/0086504 A1 | 7/2002 | Park et al. | 438/580 |
| 2002/0197790 A1 | 12/2002 | Kizilyalli et al. | 438/240 |
| 2003/0027393 A1 | 2/2003 | Kyoichi | |
| 2003/0032303 A1 | 2/2003 | Yu et al. | 438/770 |
| 2003/0045080 A1 | 3/2003 | Visokay et al. | 438/591 |
| 2003/0104706 A1 * | 6/2003 | Mitsuhashi et al. | 438/756 |
| 2005/0095842 A1 * | 5/2005 | Ishikawa et al. | 438/625 |
| 2005/0158974 A1 * | 7/2005 | Chau et al. | 438/592 |
| 2005/0164479 A1 * | 7/2005 | Perng et al. | 438/591 |

FOREIGN PATENT DOCUMENTS

| | | | |
|---|---|---|---|
| GB | 2 358 737 A | 4/2001 | |

OTHER PUBLICATIONS

PCT Search Report from PCT/US2005/023734, International Filing Date Mar. 30, 2005.

Polishchuk et al., "Dual Workfunction CMOS Gate Technology Based on Metal Interdiffusion", www.eesc.berkeley.edu, 1 page.

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages 2002.

Doczy et al., "Integrating N-type and P-type Metal Gate Transistors," U.S. Appl. No. 10/327,293, Filed Dec. 20, 2002.

Brask et al., "A Method for Making a Semiconductor Device that Includes a Metal Gate Electrode," U.S. Appl. No. 10/739,173, Filed Dec. 18, 2003.

Brask et al., "A CMOS Device with Metal and Silicide Gate Electrodes and a Method for Making it", U.S. Appl. No. 10/748,559, Filed Dec. 29, 2003.

Brask et al., "A Method for Making a Semiconductor Device with a Metal Gate Electrode that is Formed on an Annealed High-K Gate Dielectric Layer", U.S. Appl. No. 10/742,678, Filed Dec. 19, 2003.

Doczy et al., "A Method for Making a Semiconductor Device that Includes a Metal Gate Electrode", U.S. Appl. No. 10/748,545, Filed Dec. 29, 2003.

Shah et al., "A Replacement Gate Process for Making a Semiconductor Device that Includes a Metal Gate Electrode," U.S. Appl. No. 10/809,853, Filed Mar. 24, 2004.

* cited by examiner

METHOD FOR MAKING A SEMICONDUCTOR DEVICE HAVING A HIGH-K GATE DIELECTRIC LAYER AND A METAL GATE ELECTRODE

FIELD OF THE INVENTION

The present invention relates to methods for making semiconductor devices, in particular, semiconductor devices that include metal gate electrodes.

BACKGROUND OF THE INVENTION

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

When making a CMOS device that includes metal gate electrodes, a replacement gate process may be used to form gate electrodes from different metals. In that process, a first polysilicon layer, bracketed by a pair of spacers, is removed to create a first trench between the spacers. A first workfunction metal is deposited within the trench. A second polysilicon layer is then removed to create a second trench, and replaced with a second workfunction metal that differs from the first workfunction metal.

When applying such a replacement gate process, it may be advantageous to fill only part of the trenches with the workfunction metals, then fill the remainder of the trenches with a fill metal. In the resulting structure, the high-k gate dielectric layer, upon which the metal layers are formed, may spill over onto an oxide layer that separates the trenches. Similarly, part of the workfunction and fill metals may form above that oxide layer. In current processes, a polishing operation, e.g., a chemical mechanical polishing ("CMP") step, may be applied to remove the high-k gate dielectric layer, the workfunction metal, and the fill metal from above the oxide layer.

If the workfunction metals polish slowly, it may require a relatively long overpolish step to completely remove them. When such an overpolish step is not selective to the underlying high-k gate dielectric layer, significant lot to lot or wafer to wafer variation in the thickness of an underlying oxide layer may result. In some cases, severe reduction in oxide thickness may occur over parts of a wafer by the time the polishing operation is completed.

Accordingly, there is a need for an improved process for making a semiconductor device that includes a high-k gate dielectric layer and a metal gate electrode. There is a need for such a process that enables removal of fill and workfunction metals from above an underlying dielectric layer (e.g., an oxide layer) without removing significant portions of that underlying layer and without causing the dielectric layer to manifest significant variation in thickness. The method of the present invention provides such a process.

Features shown in these figures are not intended to be drawn to scale.

DETAILED DESCRIPTION OF THE PRESENT INVENTION

A method for making a semiconductor device is described. That method comprises forming a dielectric layer on a substrate, forming a trench within the dielectric layer, and forming a high-k gate dielectric layer within the trench. After forming a first metal layer on the high-k gate dielectric layer, a second metal layer is formed on the first metal layer. At least part of the second metal layer is removed from above the dielectric layer using a polishing step, and additional material is removed from above the dielectric layer using an etch step.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
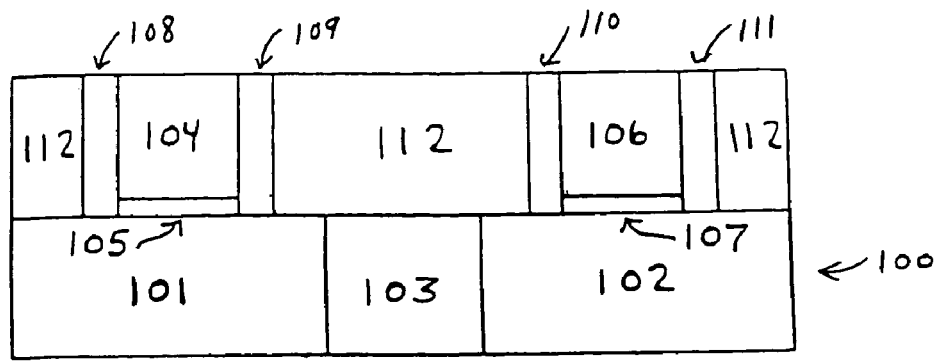
FIGS. 1a–1j represent cross-sections of structures that may be formed when carrying out an embodiment of the method of the present invention.

FIGS. 1a–1j illustrate structures that may be formed, when carrying out an embodiment of the method of the present invention. FIG. 1a represents an intermediate structure that may be formed when making a CMOS device. That structure includes first part 101 and second part 102 of substrate 100. Isolation region 103 separates first part 101 from second part 102. First polysilicon layer 104 is formed on dielectric layer 105, and second polysilicon layer 106 is formed on dielectric layer 107. First polysilicon layer 104 is bracketed by sidewall spacers 108 and 109, and second polysilicon layer 106 is bracketed by sidewall spacers 110 and 111. Dielectric 112 separates layers 104 and 106.

Substrate 100 may comprise a bulk silicon or silicon-on-insulator substructure. Alternatively, substrate 100 may comprise other materials—which may or may not be combined with silicon—such as: germanium, indium antimonide, lead telluride, indium arsenide, indium phosphide, gallium arsenide, or gallium antimonide. Although a few examples of materials from which substrate 100 may be formed are described here, any material that may serve as a foundation upon which a semiconductor device may be built falls within the spirit and scope of the present invention.

Isolation region 103 may comprise silicon dioxide, or other materials that may separate the transistor's active regions. Dielectric layers 105 and 107 may each comprise silicon dioxide, or other materials that may insulate the substrate from other substances. First and second polysilicon layers 104 and 106 preferably are each between about 100 and about 2,000 angstroms thick, and more preferably between about 500 and about 1,600 angstroms thick. In one embodiment, one layer may be doped n-type (e.g., with arsenic, phosphorus or another n-type material), while the other is doped p-type (e.g., with boron or another p-type material). Spacers 108, 109, 110, and 111 preferably comprise silicon nitride, while dielectric 112 may comprise silicon dioxide or a low-k material.

Conventional process steps, materials, and equipment may be used to generate the FIG. 1a structure, as will be apparent to those skilled in the art. As shown, dielectric 112 may be polished back, e.g., via a conventional CMP step, to expose first and second polysilicon layers 104 and 106. Although not shown, the FIG. 1a structure may include many other features (e.g., a silicon nitride etch stop layer, source and drain regions, and one or more buffer layers) that may be formed using conventional processes.

When source and drain regions are formed using conventional ion implantation and anneal processes, it may be desirable to form a hard mask on polysilicon layers 104 and 106—and an etch stop layer on the hard mask—to protect layers 104 and 106 when the source and drain regions are covered with a silicide. Such a hard mask may comprise silicon nitride. Such an etch stop layer may comprise silicon, an oxide (e.g., silicon dioxide or hafnium dioxide), or a carbide (e.g., silicon carbide).

Such an etch stop layer and silicon nitride hard mask may be polished from the surface of layers 104 and 106, when dielectric layer 112 is polished—as those layers will have served their purpose by that stage in the process. FIG. 1a represents a structure in which any hard mask or etch stop layer, which may have been previously formed on layers 104 and 106, has already been removed from the surface of those layers. When ion implantation processes are used to form the source and drain regions, layers 104 and 106 may be doped at the same time the source and drain regions are implanted. In such a process, first polysilicon layer 104 may be doped n-type, while second polysilicon layer 106 is doped p-type—or vice versa.

After forming the FIG. 1a structure, first polysilicon layer 104 is removed. In a preferred embodiment, that layer is removed by applying a wet etch process. Such a wet etch process may comprise exposing layer 104 to an aqueous solution that comprises a source of hydroxide for a sufficient time at a sufficient temperature to remove substantially all of that layer without removing a significant amount of second polysilicon layer 106. That source of hydroxide may comprise between about 2 and about 30 percent ammonium hydroxide or a tetraalkyl ammonium hydroxide, e.g., tetramethyl ammonium hydroxide ("TMAH"), by volume in deionized water.

An n-type polysilicon layer may be removed by exposing it to a solution, which is maintained at a temperature between about 15° C. and about 90° C. (and preferably below about 40° C.), that comprises between about 2 and about 30 percent ammonium hydroxide by volume in deionized water. During that exposure step, which preferably lasts at least one minute, it may be desirable to apply sonic energy at a frequency of between about 10 KHz and about 2,000 KHz, while dissipating at between about 1 and about 10 watts/cm$^2$. For example, an n-type polysilicon layer that is about 1,350 angstroms thick may be removed by exposing it at about 25° C. for about 30 minutes to a solution that comprises about 15 percent ammonium hydroxide by volume in deionized water, while applying sonic energy at about 1,000 KHz—dissipating at about 5 watts/cm$^2$.

As an alternative, an n-type polysilicon layer may be removed by exposing it for at least one minute to a solution, which is maintained at a temperature between about 60° C. and about 90° C., that comprises between about 20 and about 30 percent TMAH by volume in deionized water, while applying sonic energy. Substantially all of such an n-type polysilicon layer that is about 1,350 angstroms thick may be removed by exposing it at about 80° C. for about 2 minutes to a solution that comprises about 25 percent TMAH by volume in deionized water, while applying sonic energy at about 1,000 KHz—dissipating at about 5 watts/cm$^2$.

Figure 1B:
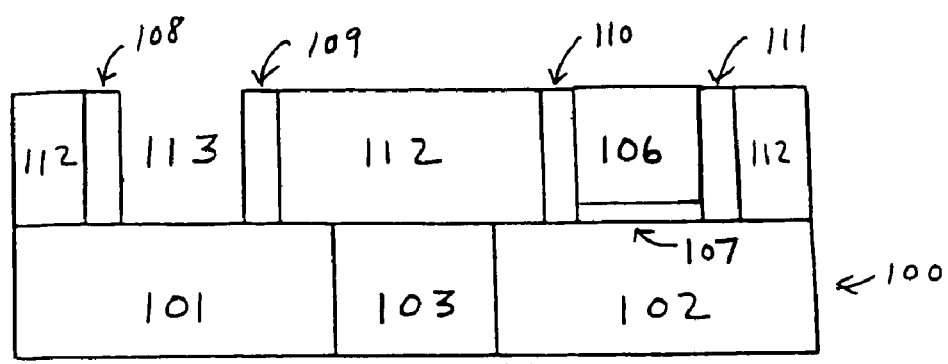

After removing first polysilicon layer 104, dielectric layer 105 is exposed. In this embodiment, layer 105 is removed. When dielectric layer 105 comprises silicon dioxide, it may be removed using an etch process that is selective for silicon dioxide. Such an etch process may comprise exposing layer 105 to a solution that includes about 1 percent HF in deionized water. The time layer 105 is exposed should be limited, as the etch process for removing that layer may also remove part of dielectric layer 112. With that in mind, if a 1 percent HF based solution is used to remove layer 105, the device preferably should be exposed to that solution for less than about 60 seconds, and more preferably for about 30 seconds or less. As shown in FIG. 1b, removal of dielectric layer 105 forms trench 113 within dielectric layer 112 positioned between sidewall spacers 108 and 109.

After removing dielectric layer 105, high-k gate dielectric layer 115 is formed within trench 113 and on substrate 100. Some of the materials that may be used to make high-k gate dielectric layer 115 include: hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form high-k gate dielectric layer 115 are described here, that layer may be made from other materials.

High-k gate dielectric layer 115 may be formed on substrate 100 using a conventional atomic layer chemical vapor deposition ("CVD") process. In such a process, a metal oxide precursor (e.g., a metal chloride) and steam may be fed at selected flow rates into a CVD reactor, which is then operated at a selected temperature and pressure to generate an atomically smooth interface between substrate 100 and high-k gate dielectric layer 115. The CVD reactor should be operated long enough to form a layer with the desired thickness. In most applications, high-k gate dielectric layer 115 should be less than about 60 angstroms thick, and more preferably between about 5 angstroms and about 40 angstroms thick.

Figure 1C:
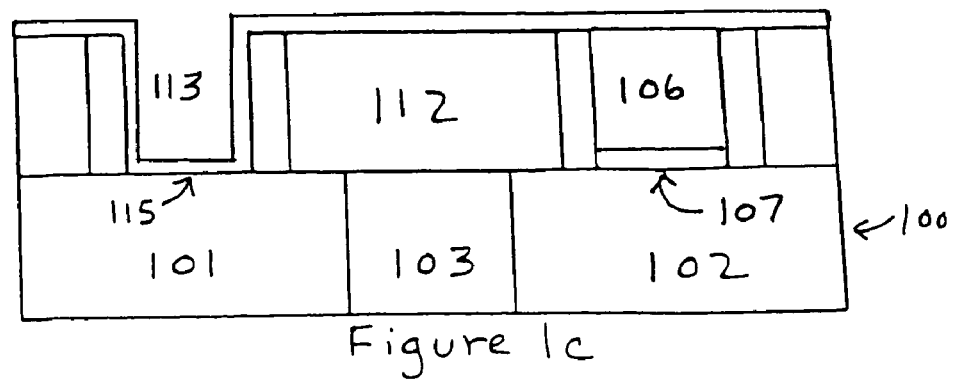

As shown in FIG. 1c, when an atomic layer CVD process is used to form high-k gate dielectric layer 115, that layer will form on the sides of trench 113 in addition to forming on the bottom of that trench, and will form on dielectric layer 112. If high-k gate dielectric layer 115 comprises an oxide, it may manifest oxygen vacancies at random surface sites and unacceptable impurity levels, depending upon the process used to make it. After layer 115 is deposited, it may be desirable to remove impurities from that layer, and to oxidize it to generate a layer with a nearly idealized metal: oxygen stoichiometry.

To remove impurities from that layer and to increase that layer's oxygen content, a wet chemical treatment may be applied to high-k gate dielectric layer 115. Such a wet chemical treatment may comprise exposing high-k gate dielectric layer 115 to a solution that comprises hydrogen peroxide at a sufficient temperature for a sufficient time to remove impurities from high-k gate dielectric layer 115 and to increase the oxygen content of high-k gate dielectric layer 115. The appropriate time and temperature at which high-k gate dielectric layer 115 is exposed may depend upon the desired thickness and other properties for high-k gate dielectric layer 115.

When high-k gate dielectric layer 115 is exposed to a hydrogen peroxide based solution, an aqueous solution that contains between about 2% and about 30% hydrogen peroxide by volume may be used. That exposure step should take place at between about 15° C. and about 40° C. for at least about one minute. In a particularly preferred embodiment, high-k gate dielectric layer 115 is exposed to an aqueous solution that contains about 6.7% $H_2O_2$ by volume for about 10 minutes at a temperature of about 25° C. During that exposure step, it may be desirable to apply sonic energy at a frequency of between about 10 KHz and about 2,000 KHz, while dissipating at between about 1 and about 10 watts/cm$^2$. In a preferred embodiment, sonic energy may be applied at a frequency of about 1,000 KHz, while dissipating at about 5 watts/cm$^2$.

Although not shown in FIG. 1c, it may be desirable to form a capping layer, which is no more than about five monolayers thick, on high-k gate dielectric layer 115. Such a capping layer may be formed by sputtering one to five monolayers of silicon, or another material, onto the surface of high-k gate dielectric layer 115. The capping layer may then be oxidized, e.g., by using a plasma enhanced chemical vapor deposition process or a solution that contains an oxidizing agent, to form a capping dielectric oxide.

Figure 1D:
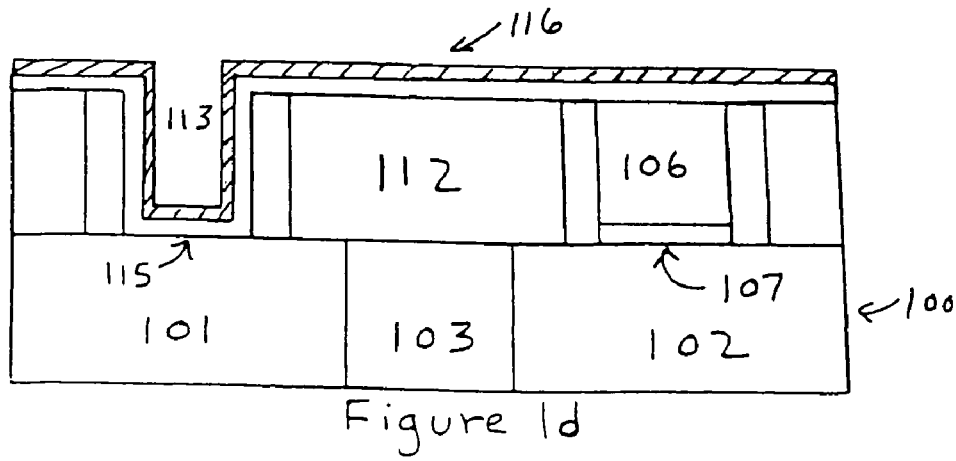

Although in some embodiments it may be desirable to form a capping layer on layer 115, in the illustrated embodiment, first metal layer 116 is formed directly on high-k gate dielectric layer 115 to generate the FIG. 1d structure. First metal layer 116 may comprise any conductive material from which a metal gate electrode may be derived, and may be formed on high-k gate dielectric layer 115 using well known physical vapor deposition ("PVD") or CVD processes. Like high-k gate dielectric layer 115, in this embodiment part of first metal layer 116 lines trench 113 while part of that layer spills over onto dielectric layer 112.

When first metal layer 116 will serve as an n-type workfunction metal, layer 116 preferably has a workfunction that is between about 3.9 eV and about 4.2 eV. N-type materials that may be used to form first metal layer 116 include hafnium, zirconium, titanium, tantalum, aluminum, and metal carbides that include these elements, i.e., titanium carbide, zirconium carbide, tantalum carbide, hafnium carbide and aluminum carbide. First metal layer 116 should be thick enough to ensure that any material formed on it will not significantly impact its workfunction. Preferably, first metal layer 116 is between about 25 angstroms and about 300 angstroms thick, and more preferably is between about 25 angstroms and about 200 angstroms thick.

Figure 1E:
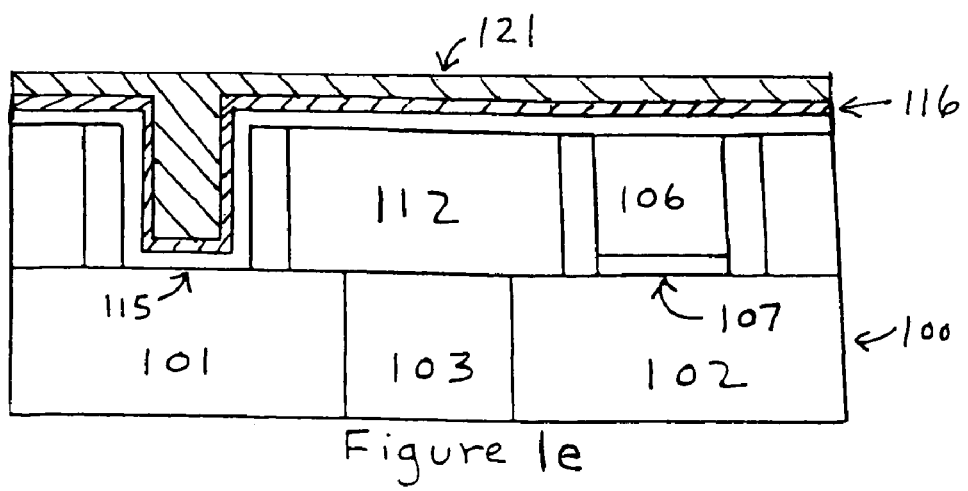
Figure 1F:
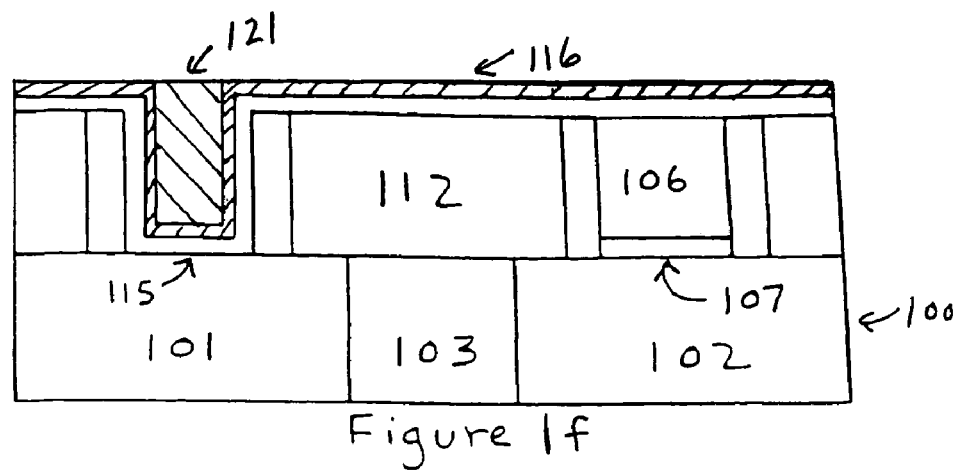

In this embodiment, after forming first metal layer 116 on high-k gate dielectric layer 115, second metal layer 121 is formed on first metal layer 116. Second metal layer 121 fills the remainder of trench 113 and covers dielectric layer 112, as illustrated in FIG. 1e. Second metal layer 121 preferably comprises a material that may be easily polished, and preferably is deposited over the entire device using a conventional metal deposition process. Such a fill metal may comprise titanium nitride, tungsten, titanium, aluminum, tantalum, tantalum nitride, cobalt, copper, nickel, or any other metal that may be polished and that may satisfactorily fill trench 113.

In a particularly preferred embodiment, fill metal 121 comprises titanium nitride. Titanium nitride may be deposited using an appropriate CVD or PVD process that does not significantly affect underlying first metal layer 116 or high-k gate dielectric layer 115. In addition, when second polysilicon layer 106 is subsequently removed (as described below), titanium nitride may be more resistant than other metals to the etch chemistry used to remove that layer. When fill metal 121 comprises tungsten, a CVD process that employs a WF$_6$ precursor may be used to deposit a tungsten layer. Care should be taken to ensure that the process used to deposit such a tungsten layer does not adversely affect the underlying workfunction and high-k gate dielectric layers. In addition, when fill metal 121 comprises tungsten, it may be necessary to select an etch chemistry for removing second polysilicon layer 106 that does not remove significant portions of that fill metal.

As an alternative to using PVD, CVD, or atomic layer CVD processes to form second metal layer 121 on first metal layer 116, second metal layer 121 may be formed on first metal layer 116 using an electroplating or electroless plating process. Plating technologies may be particularly suited for filling trenches with high aspect ratios. Various combinations of deposition and plating processes may be used to form second metal layer 121.

Figure 2A:
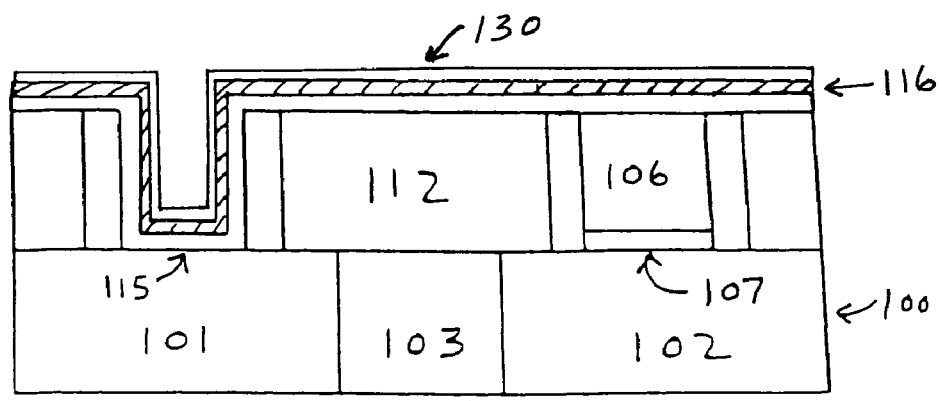
FIGS. 2a–2b represent cross-sections of structures that may be formed when carrying out a second embodiment of the method of the present invention.
Figure 2B:
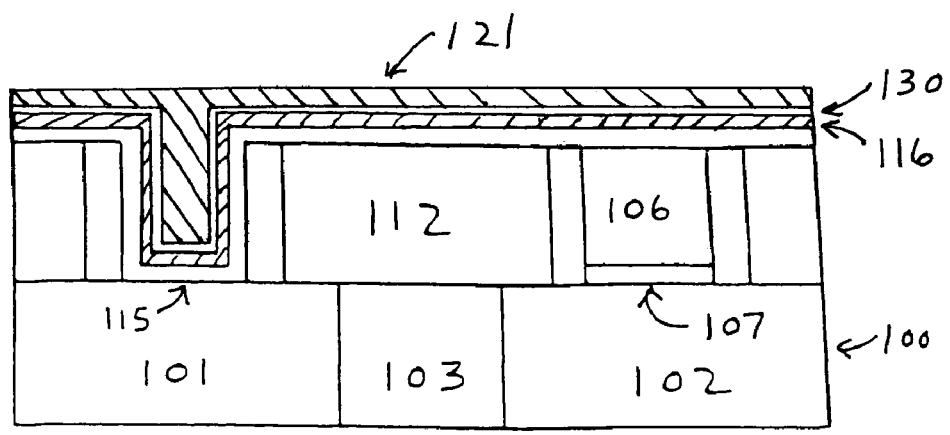

Although in this embodiment, second metal layer 121 is formed directly on first metal layer 116, in an alternative embodiment, a relatively thin sealant layer may be formed on first metal layer 116 prior to forming second metal layer 121. FIGS. 2a–2b represent cross-sections of structures that may be formed when carrying out such an alternate embodiment of the method of the present invention. As shown in FIG. 2a, sealant layer 130 is formed on first metal layer 116. Sealant layer 130 may be about 100 angstroms thick, and may be formed using a conventional deposition process.

Sealant layer 130 should comprise a highly conformal conductive layer that protects workfunction metal 116 during subsequent process steps. In this regard, sealant layer 130 should comprise a material that prevents chemicals that are used in subsequent polishing steps (e.g., slurries and post polish cleaning solutions) from degrading the performance of workfunction metal 116 and/or high-k gate dielectric layer 115. Suitable materials may include metal carbides, metal carbide alloys, metal nitrides, and metal nitride alloys. In a particularly preferred embodiment, sealant layer 130 comprises titanium carbide and is formed using a conventional atomic layer CVD process. Alternatively, sealant layer 130 may comprise a titanium nitride or tantalum nitride layer, which is formed using an atomic layer CVD or other CVD process.

In this alternative embodiment, second metal layer 121 is formed on sealant layer 130, as shown in FIG. 2b—e.g., by using the materials and process steps that are identified above in connection with FIG. 1e.

After forming the FIG. 1e structure, at least part of second metal layer 121 is removed from above dielectric layer 112 using a polishing step. In a preferred embodiment, a CMP step is applied to remove substantially all of second metal layer 121 from above dielectric layer 112 to generate the FIG. 1f structure—workfunction metal 116 acting as a polish stop. Although such a CMP step may be applied to remove all of fill layer 121 from above dielectric layer 112, while stopping on first metal layer 116, in alternative embodiments, a relatively thin portion of second metal layer 121 may remain above dielectric layer 112 following the CMP operation. Alternatively, the CMP step may remove part or all of workfunction metal 116 from above dielectric layer 112 in addition to removing fill metal 121 from above dielectric layer 112.

After that CMP step, additional material is removed from above dielectric layer 112 using an etch step. In a preferred embodiment, substantially all of first metal layer 116, which remains after the chemical mechanical polishing step, is removed from above dielectric layer 112 using a dry etch step. In a preferred embodiment, such a dry etch step is highly selective to high-k gate dielectric layer 115, enabling layer 115 to act as an etch stop. The etch step may comprise a plasma dry etch process, e.g., one using a chlorine based plasma. The duration of such a plasma dry etch process may be controlled to prevent a significant part of underlying high-k gate dielectric layer 115 from being removed during that process. Alternatively, such a plasma dry etch process may remove substantially all of high-k gate dielectric layer 115 from above dielectric layer 112, when removing the remainder of workfunction metal 116.

If the fill metal polishing step previously removed all of workfunction metal 116, then a subsequent dry etch process may be applied to remove substantially all of high-k gate dielectric layer 115, which remained after the polishing step, from above dielectric layer 112. Alternatively, any remaining portion of layer 115 may be removed using a wet etch process. Such a wet etch process may use a relatively strong acid, e.g., a halide based acid (such as hydrobromic or hydrochloric acid) or phosphoric acid. Similarly, if a previous dry etch process removed workfunction metal 116 from above dielectric layer 112, without removing all of underlying layer 115, then such a wet etch process may be employed to remove the remainder of layer 115. Such a wet etch process may also be applied to clean the surface of the resulting structure, after high-k gate dielectric layer 115 is removed from above dielectric layer 112.

Figure 1G:
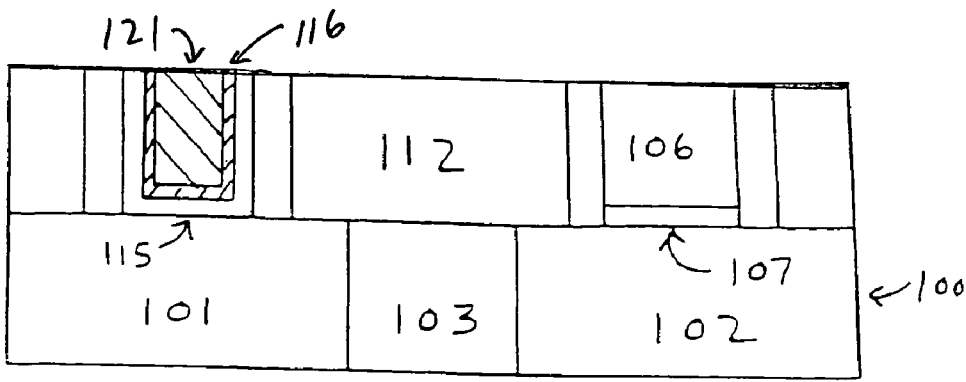

After one or more etch processes are used to remove substantially all of workfunction metal 116 and/or high-k gate dielectric layer 115 from above dielectric layer 112 to generate the FIG. 1g structure, second polysilicon layer 106 is removed. If layer 106 comprises a p-type polysilicon layer, then that layer may be removed selectively to second metal layer 121 by exposing layer 106 to a solution that comprises between about 20 and about 30 percent TMAH by volume in deionized water for a sufficient time at a sufficient temperature (e.g., between about 60° C. and about 90° C.), while applying sonic energy.

Figure 1H:
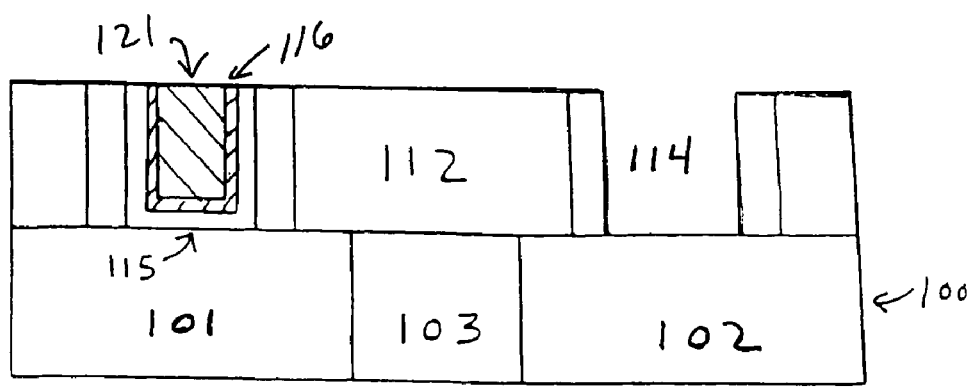

After removing second polysilicon layer 106, dielectric layer 107 is removed, e.g., by using the same process that was used to remove dielectric layer 105. Removing dielectric layer 107 generates trench 114, as FIG. 1h illustrates. Following the removal of that dielectric layer, high-k gate dielectric layer 117 is formed within trench 114 and onto dielectric layer 112. The same process steps and materials used to form high-k gate dielectric layer 115 may be used to form high-k gate dielectric layer 117.

In this embodiment, third metal layer 120 is then deposited on high-k gate dielectric layer 117. If first metal layer 116 comprises an n-type metal, then third metal layer 120 preferably comprises a p-type metal. Examples of p-type metals that may be used include: ruthenium, palladium, platinum, cobalt, nickel, and conductive metal oxides, e.g., ruthenium oxide. Although a few examples of materials that may be used to form third metal layer 120 are described here, that layer may be made from many other materials.

Third metal layer 120 may comprise a second workfunction metal that is formed on high-k gate dielectric layer 117 using a conventional PVD or CVD process. Third metal layer 120 preferably is between about 25 angstroms and about 300 angstroms thick, and more preferably is between about 25 angstroms and about 200 angstroms thick. If third metal layer 120 comprises a p-type metal, layer 120 preferably has a workfunction that is between about 4.9 eV and about 5.2 eV.

Figure 1I:
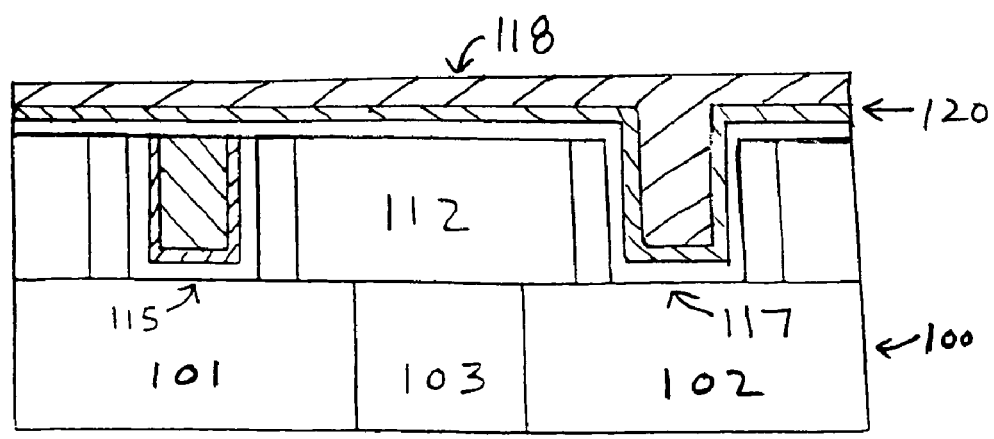
Figure 1J:
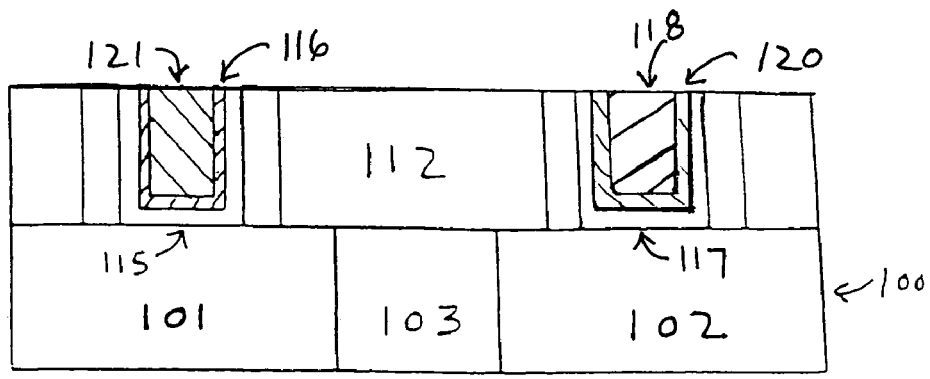

After forming third metal layer 120 on high-k gate dielectric layer 117, fourth metal layer 118, e.g., a second fill metal, may be formed on third metal layer 120 to generate the FIG. 1i structure. The same process steps and materials used to form second metal layer 121 may be used to form fourth metal layer 118. The portions of second fill metal 118, second workfunction metal 120 and high-k gate dielectric layer 117 that cover dielectric layer 112 may then be removed to generate the FIG. 1j structure. The same combination of polish and etch steps used to remove first fill metal 121, first workfunction metal 116 and high-k gate dielectric layer 115 from above dielectric layer 112 may be used to remove second fill metal 118, second workfunction metal 120 and high-k gate dielectric layer 117 from above dielectric layer 112.

After removing second fill metal 118, second workfunction metal 120 and high-k gate dielectric layer 117 from above dielectric layer 112, a capping dielectric layer (not shown) may be deposited onto the resulting structure using a conventional deposition process. Process steps for completing the device that follow the deposition of such a capping dielectric layer, e.g., forming the device's contacts, metal interconnect, and passivation layer, are well known to those skilled in the art and will not be described here.

As illustrated above, the method of the present invention enables production of CMOS devices that include a high-k gate dielectric layer and metal gate electrodes. This method enables removal of fill and workfunction metals from above an underlying dielectric layer without removing significant portions of that underlying layer and without causing the dielectric layer to manifest significant variation in thickness. This method may facilitate such a result by applying a highly selective dry etch process to remove difficult to polish workfunction metals, rather than remove them using a polishing process. Although the embodiments described above provide examples of processes for forming CMOS devices with a high-k gate dielectric layer and metal gate electrodes, the present invention is not limited to these particular embodiments.

Although the foregoing description has specified certain steps and materials that may be used in the present invention, those skilled in the art will appreciate that many modifications and substitutions may be made. Accordingly, all such modifications, alterations, substitutions and additions fall within the spirit and scope of the invention as defined by the appended claims.

What is claimed is:

1. A method for making a semiconductor device comprising:
   forming a dielectric layer on a substrate;
   forming a trench within the dielectric layer;
   forming a high-k gate dielectric layer within the trench;
   forming a first metal layer on the high-k gate dielectric layer;
   forming a second metal layer on the first metal layer;
   removing at least part of the second metal layer from above the dielectric layer using a chemical mechanical polishing step; and
   removing at least part of the first metal layer and the high-k gate dielectric layer from above the dielectric layer using a plasma dry etch step.

2. The method of claim 1 wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

3. The method of claim 1 wherein the first metal layer comprises a workfunction metal that is selected from the group consisting of hafnium, zirconium, titanium, tantalum, aluminum, a metal carbide, ruthenium, palladium, platinum, cobalt, nickel, and a conductive metal oxide.

4. The method of claim 3 wherein the first metal layer is between about 25 and about 300 angstroms thick, and has a workfunction that is between about 3.9 eV and about 4.2 eV.

5. The method of claim 3 wherein the first metal layer is between about 25 and about 300 angstroms thick, and has a workfunction that is between about 4.9 eV and about 5.2 eV.

6. The method of claim 1 wherein the second metal layer comprises a fill metal that is selected from the group consisting of titanium nitride, tungsten, titanium, aluminum, tantalum, tantalum nitride, cobalt, copper, and nickel.

7. The method of claim 1 wherein substantially all of the second metal layer is removed from above the dielectric layer using the chemical mechanical polishing step.

8. The method of claim 7 wherein substantially all of the first metal layer that remains after the chemical mechanical polishing step is removed from above the dielectric layer using the plasma dry etch step.

9. The method of claim 7 wherein substantially all of the high-k gate dielectric layer that remains after the chemical mechanical polishing step is removed from above the dielectric layer using the plasma dry etch step.

10. A method for making a semiconductor device comprising:
    forming a dielectric layer on a substrate;
    forming a trench within the dielectric layer;
    forming a high-k gate dielectric layer within the trench;
    forming a first metal layer on the high-k gate dielectric layer;
    forming a sealant layer on the first metal layer;
    forming a second metal layer on the metal carbide sealant layer;
    removing the second metal layer and at least part of the sealant layer from above the dielectric layer using a chemical mechanical polishing step; and
    removing at least part of the first metal layer and the high-k gate dielectric layer from above the dielectric layer using a plasma dry etch step.

11. The method of claim 10 wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

12. The method of claim 10 wherein the first metal layer comprises a workfunction metal that is selected from the group consisting of hafnium, zirconium, titanium, tantalum, aluminum, a metal carbide, ruthenium, palladium, platinum, cobalt, nickel, and a conductive metal oxide.

13. The method of claim 12 wherein the first metal layer is between about 25 and about 300 angstroms thick, and has a workfunction that is between about 3.9 eV and about 4.2 eV.

14. The method of claim 12 wherein the first metal layer is between about 25 and about 300 angstroms thick, and has a workfunction that is between about 4.9 eV and about 5.2 eV.

15. The method of claim 10 wherein the second metal layer comprises a fill metal that is selected from the group consisting of titanium nitride, tungsten, titanium, aluminum, tantalum, tantalum nitride, cobalt, copper, and nickel.

16. The method of claim 10 wherein the sealant layer comprises a material that is selected from the group consisting of a metal carbide, a metal carbide alloy, a metal nitride, and a metal nitride alloy.

17. The method of claim 16 wherein the sealant layer is formed using an atomic layer chemical vapor deposition process and comprises a material that is selected from the group consisting of titanium carbide, titanium nitride, and tantalum nitride.

18. A method for making a semiconductor device comprising:
    forming a dielectric layer on a substrate;
    forming a trench within the dielectric layer;
    forming a high-k gate dielectric layer within the trench;
    forming a first metal layer on the high-k gate dielectric layer;
    forming a sealant layer on the first metal layer;
    forming a second metal layer on the sealant layer;
    removing at least part of the second metal layer from above the dielectric layer using a chemical mechanical polishing step; and
    removing at least part of the sealant, the first metal layer, and the high-k gate dielectric layer from above the dielectric layer using a plasma dry etch step.

19. The method of claim 18 wherein:
    the high-k gate dielectric layer comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate;
    the first metal layer comprises a workfunction metal that is selected from the group consisting of hafnium, zirconium, titanium, tantalum, aluminum, a metal carbide, ruthenium, palladium, platinum, cobalt, nickel, and a conductive metal oxide;
    the sealant layer comprises a material that is selected from the group consisting of a metal carbide, a metal carbide alloy, a metal nitride, and a metal nitride alloy; and
    the second metal layer comprises a fill metal that is selected from the group consisting of titanium nitride, tungsten, titanium, aluminum, tantalum, tantalum nitride, cobalt, copper, and nickel.

20. The method of claim 18 wherein:
    substantially all of the second metal layer is removed from above the dielectric layer using a chemical mechanical polishing step; and
    substantially all of the first metal layer that remains after the chemical mechanical polishing step and substantially all of the high-k gate dielectric layer are removed from above the dielectric layer using a dry etch step.

* * * * *